United States Patent [19]
Osborne

[11] 4,088,960
[45] May 9, 1978

[54] MONOLITHICALLY INTEGRABLE CORRELATION DETECTOR

[75] Inventor: Paul Wray Osborne, Neptune, N.J.

[73] Assignee: Osborne-Hoffman, Inc., Point Pleasant Beach, N.J.

[21] Appl. No.: 760,344

[22] Filed: Jan. 18, 1977

[51] Int. Cl.² ............................................. G06G 7/20
[52] U.S. Cl. ................................... 328/144; 328/147; 328/160
[58] Field of Search ............... 328/144, 146, 147, 160

[56]  References Cited
U.S. PATENT DOCUMENTS

| | | | |
|---|---|---|---|
| B 411,356 | 1/1975 | Logemann | 328/144 X |
| 3,398,297 | 8/1968 | Huen | 328/144 X |
| 4,019,118 | 4/1977 | Harwood | 328/144 X |

Primary Examiner—John S. Heyman

[57] ABSTRACT

A correlation detector for detecting the presence of tones uses an improved circuit for finding the square root of the sum of the squares consisting of a two phase to multiphase converter and a magnitude comparator. The frequency response is extended to DC frequency. An improved multiplier is also described which results in very small DC offsets and provides for cancellation of whatever small DC offset which may be generated. Use of the improvements results in a monolithically integrable correlation detector.

7 Claims, 11 Drawing Figures

MONOLITHICALLY INTEGRABLE CORRELATION DETECTOR

REFERENCES

Proceedings of the IEEE, April 1963 "A circuit for the Square Root of the Sum of the Squares" by T. E. Stern and R. M. Lerner.

SUMMARY

The field of this invention relates to tone detection, specially that of pulsed tones.

An object of this invention is to provide a monolithically integrable correlation detector. A further object is embodiment of the square root of the sum of the squares function to permit handling a large range of input amplitudes and frequencies.

Another object is embodiment of a multiplier with a very small DC voltage offset with respect to a DC voltage reference, also supplied by the multiplier.

A further object is the elimination of the need for trimming resistors or trimming capacitors in a correlation detector.

Yet another object is to provide detection independent of the phase of the tone to be detected.

A still further object is a tone detector with externally programmable center frequency and which is unconditionally stable.

DRAWINGS

FIG. 5 d shows the interconnection by resistors of several current steering followers in a differential mode to result in an improved square rooting circuit.

Figure 5A:
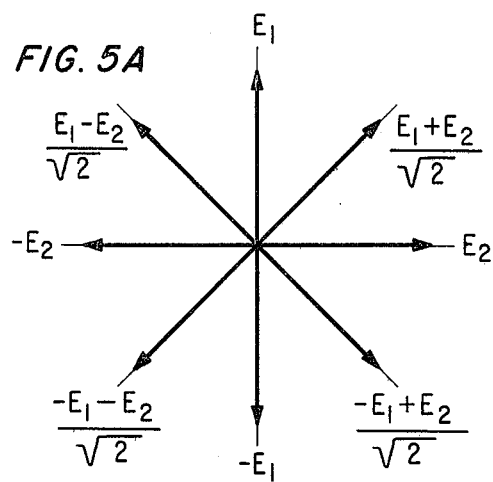
FIG. 5a shows the phasor relationship of the signals generated at the output ports of the current steering followers in FIG. 5d.
Figure 5B:
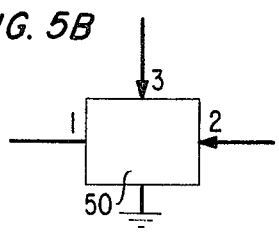
FIG. 5b shows a current steering follower in block form.
Figure 5C:
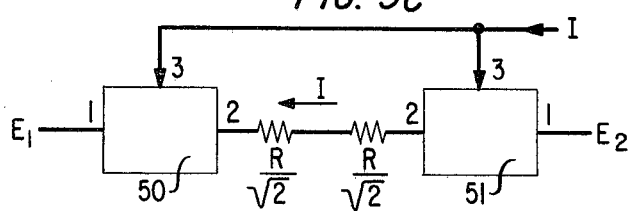
FIG. 5c shows a pair of current steering followers connected in a differential mode.
Figure 5D:
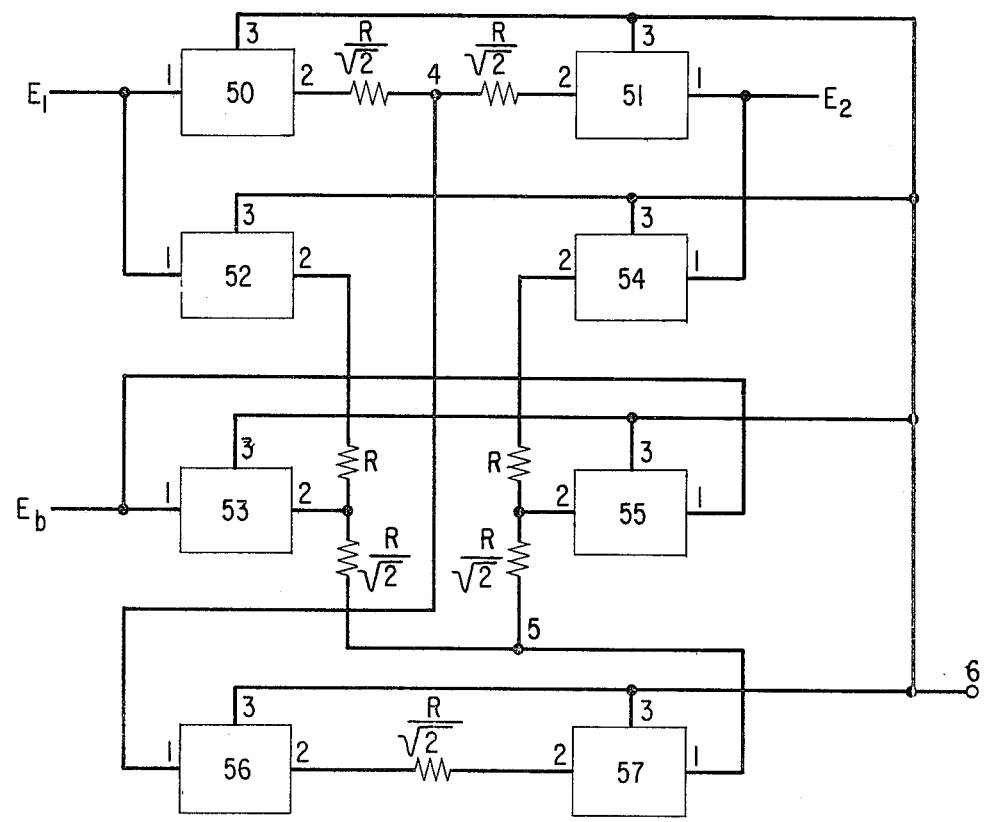
FIG. 5 shows yet another improved square rooting circuit.
Figure 5E:
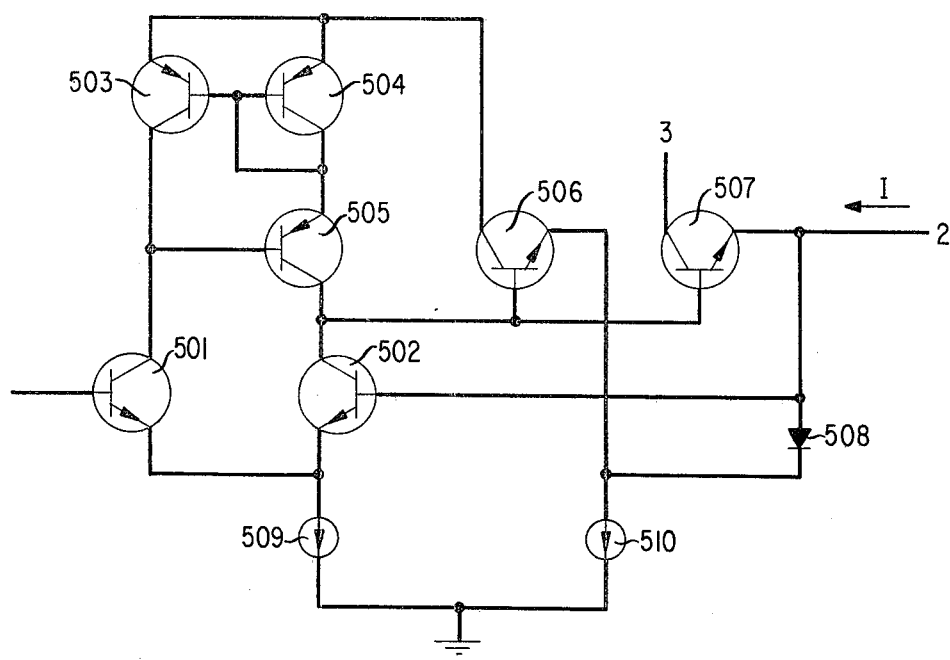

FIG. 5e shows an embodiment of the current steering follower of FIG. 5b.

Figure 6:
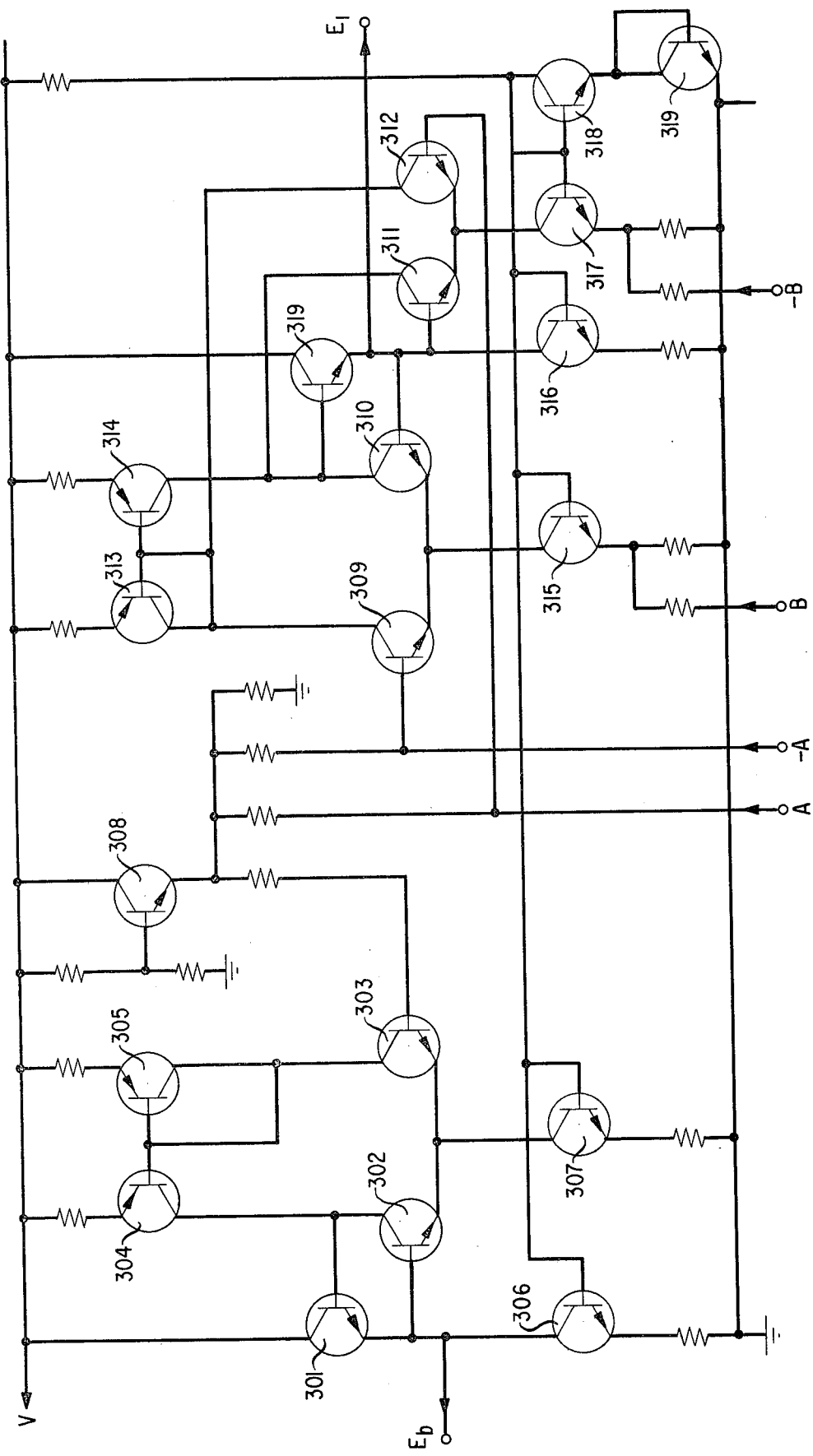

FIG. 6 shows an embodiment of an improved multiplier.

BACKGROUND OF THE INVENTION

The detection of tones, especially pulsed tones, is increasingly important in modern communications. In order to speed communications, pulsed tones are transmitted frequently and are of short duration. To achieve still greater rates of information transmission, several tones are transmitted simultaneously and must be detected. Rapidly pulsed tones, several simultaneous tones and noisy environments form important challanges in detection technology. Present technology relies mainly on active filters or on phase-locked loops for tone detection. Active filters require high Q circuits to provide noise immunity. This necessitates piezo electric or electromechanical filters, or external trimming to control the center frequency.

Active filters therefore are not integrable using monolithic techniques. Hybrid filters, using non-monolithic techniques, are bulky and expensive. Furthermore, because hybrid filters are not frequency programmable, different applications require different filters to operate at new frequencies. The phase-locked loop has a sluggish response to short tone bursts. If the bandwidth of the phase-locked loop were widened to hasten its response, its noise immunity would decrease. Moreover, the phase-locked loop is phase sensitive, which results in less reliable tone acquisition for some phase errors than for others. If the phase of the incoming signal is random with respect to the phase-locked loop reference frequency, as it is in many applications, the tone may be detected with an unacceptable jitter. In more extreme situations, the tone may be missed altogether.

Figure 1:
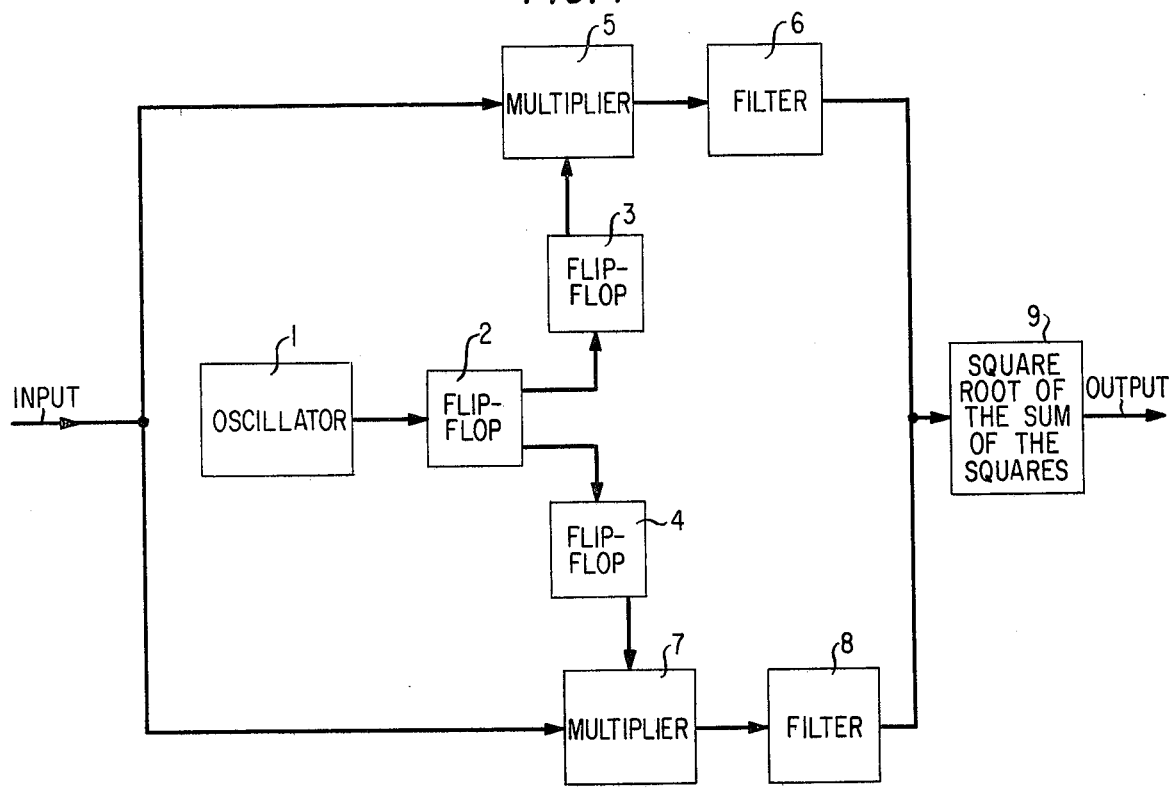
FIG. 1 is a block diagram of a correlation detector.

It is well known that the optimum linear detector for pulsed tones is the correlation detector. A block diagram of the correlation is shown in FIG. 1. While the best filters 6 and 8 are matched filters to the pulse shape, in practice RC networks are used because in most cases RC networks closely approximate the performance of the matched filter. The correlation detector is discussed in detail in the literature. This invention results in a monolithically integrable correlation detector by the improvements in the square rooting circuit 9 and the multipliers 5 and 7. Unlike in active filters, there is no need to trim resistors or capacitors, the frequency of operation is externally programmable, and the detector is unconditionally stable for all filter configurations in a correlation detector. And unlike a phase-locked loop, the correlation detector is insensitive to the signal to be detected. Applications of a monolithically integrable correlation detector include telephone switching, touch tone detection, computer intercommunication, remote control of machines and appliances by tones, radio signaling, burglar alarms, modems, credit card verification, bank checking, and extraction of pulsed tones in noise for echo ranging. A review of the operation of the correlation detector follows.

DESCRIPTION OF THE INVENTION

Reference is made to FIG. 1, which shows a block diagram of a correlation detector. This invention describes improvements in 5, 7, and 9. An oscillator 1, oscillating at a frequency four times greater than the input tone frequency, generates a stream of pulses which drives flip-flop 2. The set output of flip-flop 2 triggers flip-flop 3 and the reset output of flip-flop 2 triggers flip-flop 4, the consequence of which is to result in a 90° phase shift, called quadrature, between the outputs of flip-flop 3 and flip-flop 4, both outputs being at the frequency of the input tone. The input tone is caused in multiplier 5 and multiplier 7 to be multiplied by the outputs of flip-flops 3 and 4, and thereby results in the output of multiplier 5 and the output of multiplier 7 to be in quadrature with each other. The output of multiplier 5 is filtered in low pass filter 6 and the output of multiplier 7 is filtered in low pass filter 8. The square root of the sum of the squares of the output of filter 6 and filter 8 is obtained in 9 and forms the detected tone which is the output of the correlation detector. Oscillator 1 and flip-flops 2, 3, and 4 are digital circuits which are monolithically integrable in the known art. Combination of the improvements and the known art results in a monolithically integrable correlation detector.

Figure 2:
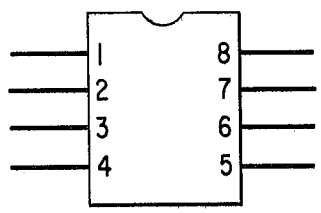
FIG. 2 shows a pin-out of a monolithically integrated correlation detector.

Reference is made to FIG. 2 which shows a monolithically integrated correlation detector in an integrated circuit package, with numerals corresponding to pins on the package. One of the pins is used for connecting the voltage supply and one pin for ground; one pin for the input tone to be detected and one pin for the output of the correlation detector; one pin is used for attaching an external capacitor to control the center frequency of the oscillator and two pins are used to vary the bandwith of filter 6 and filter 8 by means of external capacitors. The facility for external capacitors permits a widened use for the integrated circuit, because each user may wish to adapt the correlation detector to his particular system bandwidth. A frequency response down to DC frequency is essential for the square root of the sum of the squares circuit in a correlation detector. The improvements herein specified are responsive to signals down to DC frequency and are composed of resistors and transistors, all of which are monolithically integrable.

Figure 3:
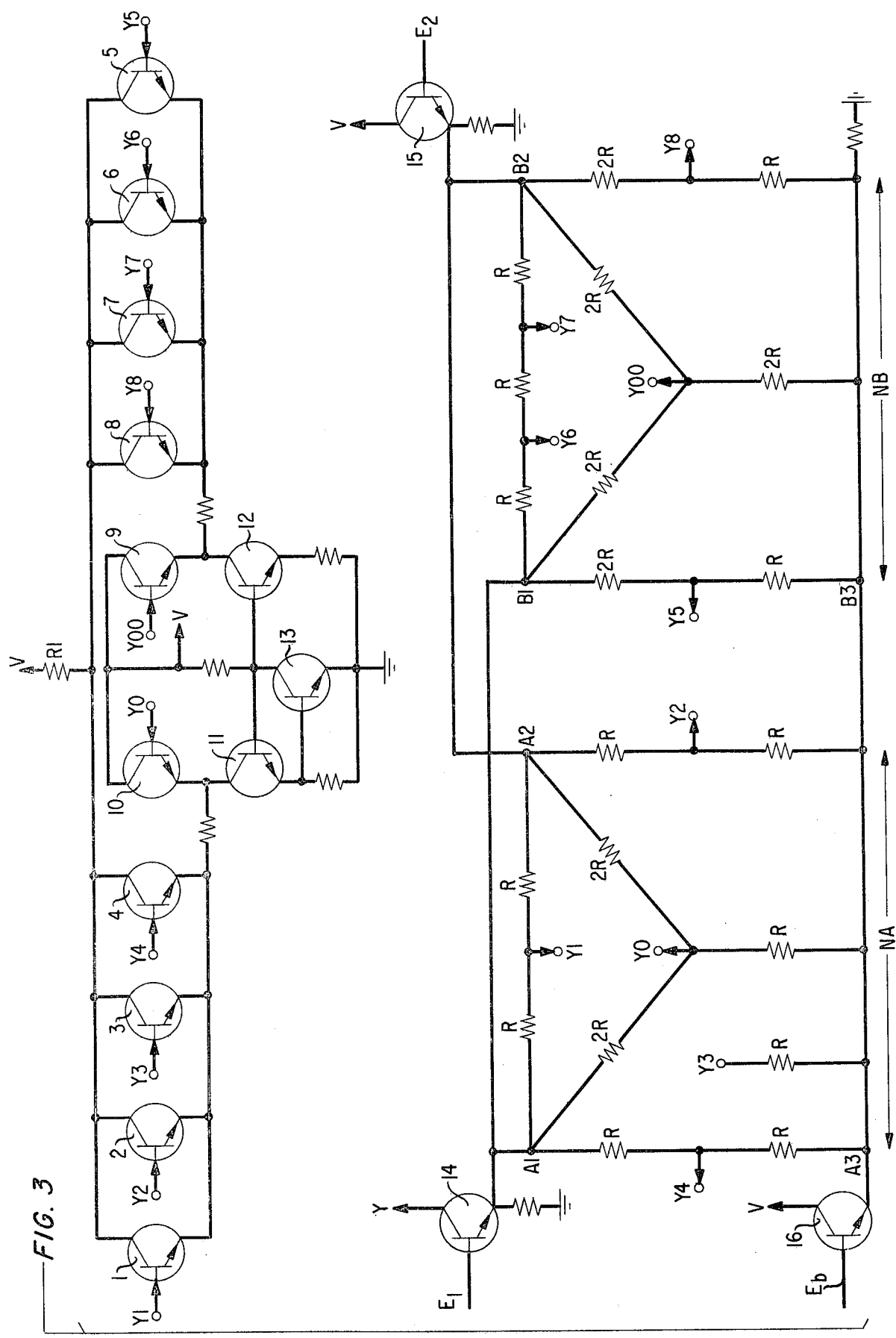
FIG. 3 is an improved embodiment of a circuit for finding the square root of the sum of the squares, comprising a two phase to multiphase converter and a magnitude comparator.
Figure 4A:
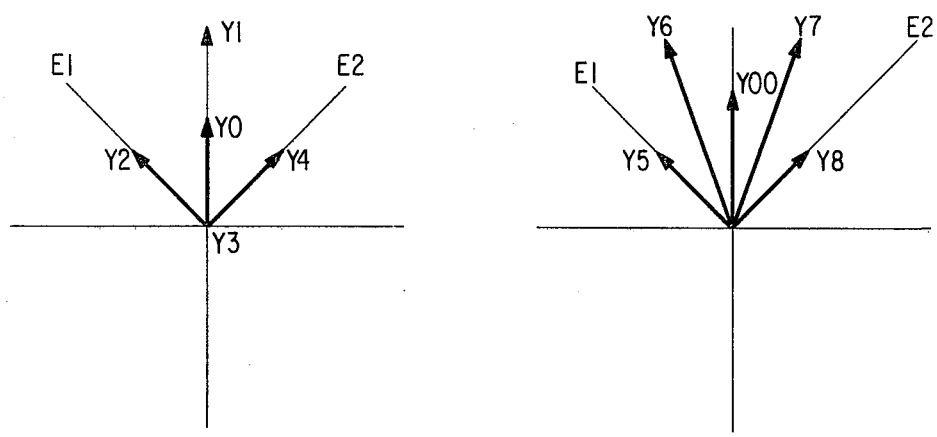
FIGS. 4a–4b show the phasor relationship of the signals in FIG. 3.
Figure 4B:
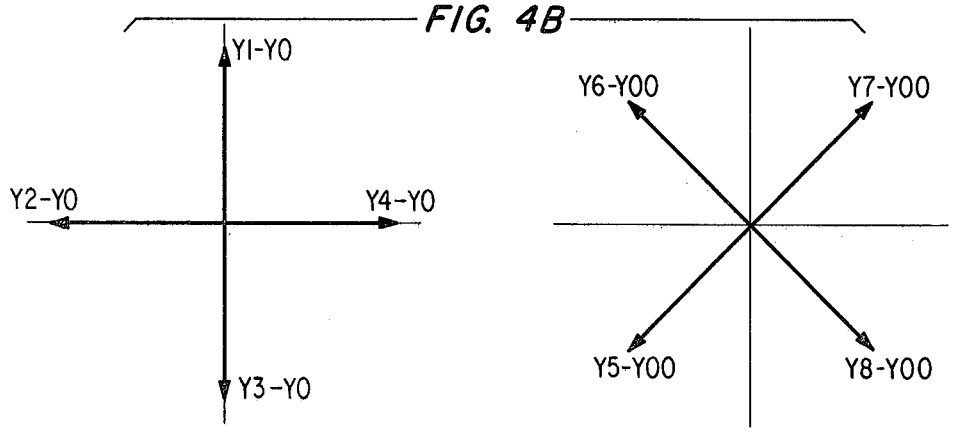

Reference is made to FIG. 3, which shows an improvement in a square root of the sum of the squares circuit. The input signals $E_1$ and $E_2$ impinging on the bases of 14 and 15 are in quadrature phase, whereas the input signal $E_b$ on the base of 16 is at a DC level equal to the DC offset of the signals on the bases of 14 and 15. The quadrature signals are generated in multipliers and are passed through filters as shown in FIG. 1. The emitters of 14, 15, and 16 follow the bases in voltage down to DC frequency, being offset by a voltage drop due to the base-emitter junctions. A first network, network NA, is responsive to voltages driven by the emitters of 14, 15, and 16. The several nodes of the network are connected by resistors and in accordance with Ohm's Law voltages proportional to the signals at these emitters and to the value of the resistor ratios are developed at nodes $y_1$, $y_2$, $y_3$, $y_4$, and $y_0$, with $y_0$ being denoted a reference node. A second resistive network, network NB, is responsive to voltages driven by the emitters of 14, 15, and 16 such that in accordance with Ohm's Law voltages proportional to the signals at these emitters and resistor ratios are developed at nodes $y_5$, $y_6$, $y_7$, $y_8$, and $y_{00}$, with $y_{00}$ being denoted a reference node. The resultant phasor relationships of the voltages at these nodes is caused to be formed by superposition of the driving signals $E_1$, $E_2$ and $E_b$ and Ohm's Law, and is shown in FIG. 4a. The conversion of the two phase quadrature signals to the multiphase signals on the aforementioned nodes having been accomplished in the resistive network, transistors 1, 2, 3, 4 and 10 and transistors 5, 6, 7, 8 and 9 form the differential rectifiers of a magnitude comparator for which transistors 11 and 12 supply a constant current, with the current controlled by the base to emitter drop of 13. The largest of the signals on nodes $y_1$, $y_2$, $y_3$, and $y_4$, compared to $y_0$ determines which of transistors 1, 2, 3, or 4 turns on, and the largest of the signals on nodes $y_5$, $y_6$, $y_7$, and $y_8$, compared to $y_{00}$ determines which of transistors 5, 6, 7, or 8 turns on. The current caused to flow through the transistor which is on is proportional to the difference in voltage between the aforementioned nodes and the reference. The resultant phasor relationship of the current through the aforesaid transistors is shown in FIG. 4b. The DC voltages at all nodes of the resistive network being the same, any DC offset of signals $E_1$ and $E_2$ is cancelled by generating a current proportional to the difference between the voltages at the aforementioned nodes and the reference. The current passing through $R_1$ is responsive to the sum of the currents through transistors 1, 2, 3, 4, 5, 6, 7, and 8 and develops a voltage across $R_1$ which is proportional to the largest of the phasors, thereby developing the square root of the sum of the squares of $E_1$ and $E_2$ across $R_1$. It will be obvious that the embodiment of the two phase to multiphase converter and magnitude comparator shown in FIG. 3 for the case of two phase to eight phase is illustrative of an approach clearly extendable to any number of output phases. The larger the number of output phases, the more precisely does the output result in the square root of the sum of the squares.

The embodiment of FIG. 3 requires that the signal levels at the bases of transistors 1, 2, 3, 4, 5, 6, 7, 8, 9, and 10 of the magnitude comparator be sufficiently large so as to overcome the base to emitter voltage drop. In order to increase the dynamic range of the square root of the sum of the squares circuit, yet another new circuit is devised which combines the two phase to multiphase converter and magnitude comparator and does not require that the amplitude of the signal overcome a base to emitter voltage drop. This improvement is illustrated by the embodiment of FIG. 5, wherein a new current steering follower is the basic building block of the improved circuit. FIG. 5b shows a block diagram of a current steering follower 50, wherein a current entering port 2 is steered to ground and whereas a current leaving port 2 is sourced by port 3, port 2 and port 1 being input ports to a differential amplifier. In FIG. 5c the circuit 50 of FIG. 5b is connected by means of resistors to a second such current steering follower 51, the resistors being connected between port 2 of 50 and port 2 of 51, circuits 50 and 51 thereby being connected in a differential mode. By applying voltage $E_1$ to port 1 of 50, and a second $E_2$ to port 1 of 51, a differential current I is caused to flow between port 2 of 50 and port 2 of 51, which is proportional to the difference between voltages $E_1$ and $E_2$. When $E_1$ is larger than $E_2$, current I enters 51 and is sourced by port 3 of 51. When $E_2$ is larger than $E_1$, current I enters 50 and is sourced by port 3 of 50. Joining port 5 of 50 and port 3 of 51, causes a current I to flow in this juncture which is proportional to the magnitude of the difference between $E_1$ and $E_2$. Several current steering followers connected in a differential mode as shown in FIG. 5c are combined in FIG. 5d to result at terminal 6 in the square root of the sum of the squares of $E_1$ and $E_2$. $E_1$ drives port 1 of current steering followers 50 and 52, whereas $E_2$ drives port 1 of current steering followers 51 and 54. 50 and 51 being connected in the differential mode, a current proportional to the magnitude of the difference between $E_1$ and $E_2$ enters port 3 of either 50 or 51. $E_b$ drives port 1 of current steering followers 53 and 55; 52 and 53 being connected in the differential mode, a current proportional to the magnitude of the difference between $E_1$ and $E_b$ enters port 3 of either 52 or 53; 54 and 55 being connected in the differential mode, a current proportional to the magnitude of the difference between $E_2$ and $E_b$ is sourced by port 3 of either 54 or 55. Connecting node 4 to port 1 of 56 results in one half the difference between $E_1$ and $E_2$ being applied to port 1 of 56, and connecting node 5 to port 1 of 57 results in applying $E_b$ to port 1 of 57. 56 and 57 being connected in the differential mode results in a current proportional to one half the sum of $E_1$ plus $E_2$, less $E_b$ to be sourced by port 3 of either 56 or 57. Port 3 of 50, 51, 52, 53, 54, 55, 56 and 57 being joined in common to terminal 6 results in the summation of the magnitude of phasors formed by combinations of $E_1$, $E_2$, and $E_b$, as described in this paragraph, to be present at terminal 6 in the form of a voltage. The phasor diagram of these phasors is shown in FIG. 5a. The square root of the sum of the squares of $E_1$ and $E_2$ is very nearly equal to the sum of the magnitude of these phasors, developed at terminal 6. As the number of phasors generated is increased, the voltage at terminal 6 more closely approaches the exact square root of the sum of the squares. FIG. 5e shows an embodiment of a current steering follower 50. An input current I into port 2 causes the current through transistor 502 to increase, thus pulling the base of transistors 506 and 507 lower in voltage, turning diode 508 on, and shunting I to ground through bias current source 510. When current I flows away from port 2, current through transistor 502 decreases and the bases of 506 and 507 rise, turning off diode 510 and thereby requiring transistor 507 to source current I, whereby a current equal to I enters port 3. It is obvious that multiple phases of any desired number may be generated by combining current steering followers in a differential mode following the example of FIG. 5d for eight phases.

Reference is made to FIG. 6, which shows an embodiment of an improved multiplier. A large range of input amplitudes without the need for trimmer resistors or capacitors is handled by the multiplier, as a consequence of the small DC offset voltage at the multiplier output, and because a separate output port provides a voltage equal to this small DC offset voltage. The circuit portion comprised of transistors 301, 302, 303, 304, 305, 306 and 307 forms a first voltage follower identical to a second voltage follower comprised of transistors 319, 309, 310, 313, 314, 316, and 315 and to a third voltage follower comprised of transistors 319, 311, 312, 313, 314, 317 and 316. Signal A drives the base of 312, whose bias current is chopped by signal — B on the emitter of 317. The current through transistor 312 is mirrored into transistor 311 by the Wilson current source formed by transistors 313 and 314. The voltage at the base of 311 is forced to be equal to that of the base of 312, when the chopper voltage — B of the polarity to turn the current through 312 on. When the voltage — B does not turn the third voltage follower on, the voltage B being of opposite polarity turns the second voltage follower on, and the voltage at the base of transistor 310 follows the base of transistor 309 as has been described for the case of the third voltage follower, the base of 309 being driven by signal A. The base of 310 and the base of 311 being tied to a common output port, the voltage at said output port alternately follows input voltages A and −A, the chopping rate being determined by B and −b. The first voltage follower not being chopped and being always on, the base of transistor 302 always follows the voltage at the base of 303, this voltage being equal to the bias voltage at the base of 309 and 312, transistors 303, 309, and 312 receiving their bias voltage in common from the emitter of 308 through a resistor connecting each of said bases to the emitter of 308. The DC offset at the base of 310 being equal to the DC bias of 309 and 312, and the base of 302 being shown to be at the same bias as 309 and 312, voltage $E_b$ at the base of 302 is equal to the DC offset at the base of 310. The base of 310 being a multiplier output port generating one of two quadrature signals in a correlation detector, voltage $E_b$ is equal to the DC offset in the multiplier output signal.

I claim:

1. In a correlation detector for detecting tones, a circuit for finding the square root of the sum of the squares of quadrature signals generated in multipliers of the correlation detector comprising:
   (a) a two phase to multiphase converter means converting two input signals in quadrature into varying amplitude multiphase signals; and
   (b) a magnitude comparator means connected to said converter means driven by said multiphase signals and responsive to said multiphase signals generated in the two phase to multiphase converter, and means for detecting the largest amplitude of said multiphase signals whereby the said largest amplitude signal substantially represents the square root of the sum of the squares of said quadrature signals.

2. A square root circuit as described in claim 1 wherein said two phase to multiphase converter further comprises:
   (a) a resistive network;
   (b) means for providing driving signals having DC offsets at the resistive network such that said two phase to multiphase converter is responsive to zero frequency; and
   (c) means included in the resistive network to provide a reference signal at the output of said two phase to multiphase converter for cancellation of DC offsets appearing on the driving signals.

3. A square root circuit as described in claim 1 wherein said two phase to multiphase converter converts said two phase input to an eight phase output, comprising:
   (a) a first voltage follower responsive to a first signal;
   (b) a second voltage follower responsive to a second signal in quadrature with said first signal;
   (c) two resistive networks each connected to and driven by said first and second voltage followers respectively;
   (d) a third voltage follower connected to each of said two resistive networks and responsive to a DC voltage and driving a reference port of said resistive networks; and
   (e) output nodes corresponding to each of the eight output phases and to two output reference signals, said nodes being interconnected by resistors of said resistive networks.

4. In a correlation detector for detecting tones, a circuit for finding the square root of the sum of the squares of quadrature signals generated in two multipliers, comprising:
   (a) an array of current steering follower means driven by said quadrature signals; and
   (b) a resistive array differentially connected to said array of current steering follower means for producing a plurality of varying amplitude multiphase signals whereby the largest amplitude of said multiphase signals is steered to an output port and wherein said largest amplitude signal substantially represents the square root of the sum of the squares of said quadrature signals.

5. A square root circuit as described in claim 4 wherein said array of current steering follower means comprises a plurality of current steering follower pairs, each pair further comprising:
   (a) a first current steering follower; and
   (b) a second current steering follower, resistor means connecting said second current steering follower to said first current steering follower such that the combination operates in a differential mode whereby an output current proportional to the magnitude of the difference in input voltages to said current steering followers is generated.

6. A square root circuit as described in claim 4 wherein said array of current steering follower means each comprises:
   (a) a differential amplifier;
   (b) an input port to said differential amplifier into which an input current in a first direction causes a current to flow from said output port of said current steering follower; and
   (c) means connected to said input port for shunting said input current to ground whenever the direction of said input current is in the direction opposite to said first direction.

7. A square root circuit as described in claim 4 wherein said quadrature signals are generated in two multipliers and wherein a differential voltage follower generates a signal equal to the DC offset of two multipliers, comprising:
   (a) a first differential voltage follower connected from its input port by resistive means to an input port of each of a second and third differential voltage follower, producing a DC offset equal to the DC offset of said second and third differential voltage followers;
   (b) a second differential voltage follower comprising the first of said multipliers, driven by a first signal and chopped conductive by a second signal; and
   (c) a third differential voltage follower comprising the second of said multipliers, connected in parallel to said second voltage follower, driven by said first signal inverted and chopped conductive by said second signal when said second voltage follower is chopped nonconductive, chopped nonconductive when said second voltage follower is chopped conductive, and whereby a signal in quadrature with a signal produced by said second voltage follower is produced.

* * * * *